US011869851B2

(12) United States Patent
Takekida

(10) Patent No.: US 11,869,851 B2
(45) Date of Patent: Jan. 9, 2024

(54) SEMICONDUCTOR STORAGE DEVICE

(71) Applicant: Kioxia Corporation, Tokyo (JP)

(72) Inventor: Hideto Takekida, Nagoya Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/189,725

(22) Filed: Mar. 2, 2021

(65) Prior Publication Data

US 2021/0335727 A1    Oct. 28, 2021

(30) Foreign Application Priority Data

Apr. 28, 2020   (JP) .................. 2020-079270

(51) Int. Cl.
| | |
|---|---|
| H01L 23/535 | (2006.01) |
| H01L 23/00 | (2006.01) |
| H01L 23/528 | (2006.01) |
| H01L 23/532 | (2006.01) |
| H01L 23/522 | (2006.01) |
| H10B 43/27 | (2023.01) |

(52) U.S. Cl.
CPC ........ H01L 23/562 (2013.01); H01L 23/5226 (2013.01); H01L 23/5283 (2013.01); H01L 23/535 (2013.01); H01L 23/53257 (2013.01); H10B 43/27 (2023.02)

(58) Field of Classification Search
CPC ......... H01L 27/11582; H01L 27/11556; H01L 27/11575; H01L 27/11573; H01L 27/11565; H10B 43/27; H10B 43/10; H10B 43/50; H10B 41/27; H10B 43/40
See application file for complete search history.

(56) References Cited

U.S. PATENT DOCUMENTS

| | | | |
|---|---|---|---|
| 9,691,782 B1 * | 6/2017 | Hwang | ............ H01L 27/11573 |
| 2010/0013049 A1 | 1/2010 | Tanaka et al. | |
| 2015/0041901 A1 | 2/2015 | Son et al. | |
| 2016/0204117 A1 | 7/2016 | Liu et al. | |
| 2016/0322382 A1 | 11/2016 | Lee | |
| 2017/0053923 A1 * | 2/2017 | Hwang | ............ H01L 27/11582 |
| 2017/0062455 A1 | 3/2017 | Nomura | |
| 2017/0062462 A1 | 3/2017 | Lee | |
| 2019/0280006 A1 | 9/2019 | Lee et al. | |
| 2019/0296032 A1 | 9/2019 | Noda | |
| 2021/0249433 A1 * | 8/2021 | Shamanna | ........ H01L 27/11519 |

FOREIGN PATENT DOCUMENTS

| | | |
|---|---|---|
| CN | 107342291 A | 11/2017 |
| CN | 110246844 A | 9/2019 |
| JP | 2010-027870 A | 2/2010 |

* cited by examiner

*Primary Examiner* — Tony Tran
(74) *Attorney, Agent, or Firm* — Foley & Lardner LLP

(57) ABSTRACT

A semiconductor storage device includes a substrate, a first stacked body provided above the substrate and having a side portion configured in a staircase pattern, a plurality of columnar portions passing through the first stacked body, a second stacked body provided in an outer edge portion of the substrate, and a plurality of first slits. The first stacked body include a plurality of first insulating layers and a plurality of conductive layers that are alternately stacked. The second stacked body includes the plurality of first insulating layers and the plurality of conductive layers that are alternately stacked. The plurality of first slits extends through the first and second stacked bodies in a direction intersecting a stacking direction of the first stacked body.

3 Claims, 14 Drawing Sheets

SEMICONDUCTOR STORAGE DEVICE

CROSS-REFERENCE TO RELATED APPLICATION(S)

This application is based upon and claims the benefit of priority from Japanese Patent Application No. 2020-079270, filed Apr. 28, 2020, the entire contents of which are incorporated herein by reference.

FIELD

Embodiments described herein relate generally to semiconductor storage devices.

BACKGROUND

A semiconductor storage device including a three-dimensional memory cell array in which memory cells are three-dimensionally arranged is developed. It was discovered that, in such a semiconductor storage device, a crystal defect tended to appear in a substrate between the memory cell array and a peripheral region thereof (a kerf region).

DETAILED DESCRIPTION

Embodiments provide a semiconductor storage device that can prevent a crystal defect in a semiconductor substrate.

In general, according to one embodiment, a semiconductor storage device includes a substrate. A first stacked body is provided above the substrate and configured with a plurality of first insulating layers and a plurality of conductive layers which are alternately stacked. The first stacked body has a side portion configured in a staircase pattern. A plurality of columnar portions pass through the first stacked body. A second stacked body is provided in an outer edge portion of the substrate so as to face the side portion of the first stacked body and configured with the plurality of first insulating layers and the plurality of conductive layers which are alternately stacked. The second stacked body has a side portion which faces the first stacked body and is configured in a staircase pattern. A plurality of first slits are provided in the first and second stacked bodies in an arrangement direction of the first and second stacked bodies when viewed from a stacking direction of the first stacked body. The plurality of first slits pass through the first and second stacked bodies.

Hereinafter, embodiments will be described with reference to the drawings. The embodiments are not intended for limitation. In the following embodiments, the vertical direction of a semiconductor substrate corresponds to a relative direction observed when a surface on which a semiconductor device is to be provided is assumed to be an upper surface, and may be different from a vertical direction in accordance with the acceleration of gravity. The drawings are schematic or conceptual drawings and the ratio between the portions, for example, is not always identical to the actual ratio. In the specification and drawings, any element which is similar to that described in connection with the already explained drawing is denoted by the same reference sign and detailed explanations thereof are omitted as appropriate.

First Embodiment

Figure 1:
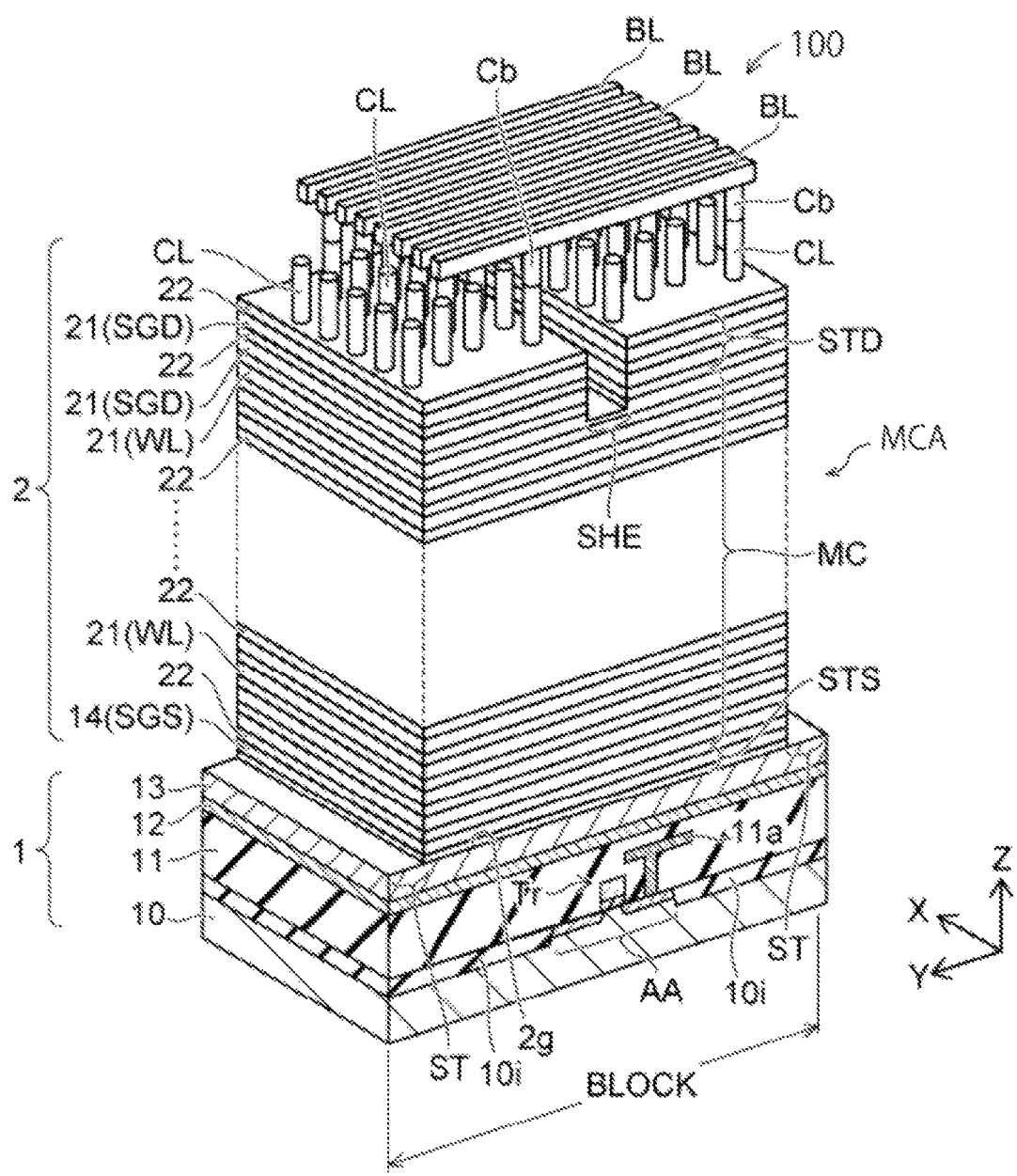
FIG. 1 is a perspective view showing an example of the configuration of a semiconductor storage device according to a first embodiment.

FIG. 1 is a perspective view showing an example of the configuration of a semiconductor storage device according to a first embodiment. A semiconductor storage device 100 may be, for example, NAND flash memory including a three-dimensional memory cell array MCA in which memory cells are three-dimensionally arranged. In the present embodiment, a stacking direction of a stacked body 2 is assumed to be a Z direction. One direction intersecting (for example, orthogonal to) the Z direction is assumed to be a Y direction. A direction intersecting (for example, orthogonal to) each of the Z and Y directions is assumed to be an X direction.

The semiconductor storage device 100 includes a base portion 1, the stacked body 2, and a plurality of columnar portions CL.

The base portion 1 includes a substrate 10, an insulating film 11, a conductive film 12, and a semiconductor layer 13. The insulating film 11 is provided on the substrate 10. The conductive film 12 is provided on the insulating film 11. The semiconductor layer 13 is provided on the conductive film 12. The substrate 10 is a semiconductor substrate, for example, a p-type silicon substrate. An element isolation region 10i, for example, is provided in a surface region of the substrate 10. The element isolation region 10i is an insulating region containing silicon oxide, for example, and defines an active area AA in the surface region of the substrate 10. Source and drain regions of a transistor Tr are provided in the active area AA. The transistor Tr constitutes a peripheral circuit (for example, a complementary metal oxide semiconductor (CMOS) circuit) of nonvolatile memory. The insulating film 11 contains silicon oxide (SiO$_2$), for example, and insulates the transistor Tr. A trace 11a is provided in the insulating film 11. The trace 11a is a trace electrically connected to the transistor Tr. The conductive film 12 contains conductive metal, for example, tungsten (W). The semiconductor layer 13 contains silicon, for example. The conductivity type of silicon is an n-type, for example. Part of the semiconductor layer 13 may contain undoped silicon.

The stacked body 2 is present above the substrate 10 and is located in the Z direction with respect to the semiconductor layer 13. The stacked body 2 is configured with a plurality of conductive layers 21 and a plurality of insulating layers 22 which are alternately stacked in the Z direction. The conductive layer 21 contains conductive metal, for example, tungsten. The insulating layer 22 contains silicon oxide, for example. The insulating layer 22 insulates the conductive layers 21 from each other. Any number of conductive layers 21 and any number of insulating layers 22 may be stacked. The insulating layer 22 may be an air gap, for example. An insulating film 2g, for example, is provided between the stacked body 2 and the semiconductor layer 13. The insulating film 2g contains silicon oxide (SiO$_2$), for example. The insulating film 2g may contain a high-dielectric substance whose relative dielectric constant is higher than that of silicon oxide. The high-dielectric substance is metal oxide, for example.

The conductive layers 21 include at least one source-side select gate SGS, a plurality of word lines WL, and at least one drain-side select gate SGD. The source-side select gate SGS is a gate electrode of a source-side select transistor STS. The word line WL is a gate electrode of a memory cell MC. The drain-side select gate SGD is a gate electrode of a drain-side select transistor STD. The source-side select gate SGS is provided in a lower region of the stacked body 2. The drain-side select gate SGD is provided in an upper region of the stacked body 2. The lower region refers to a region, which is close to the base portion 1, of the stacked body 2 and the upper region refers to a region, which is far from the base portion 1, of the stacked body 2. The word lines WL are provided between the source-side select gate SGS and the drain-side select gate SGD.

The Z-direction thickness of an insulating layer 22 of the plurality of insulating layers 22, which insulates the source-side select gate SGS and a word line WL from each other, may be greater than the Z-direction thickness of an insulating layer 22 of the plurality of insulating layers 22, which insulates a word line WL and a word line WL from each other, for example. Furthermore, a cover insulating film may be provided on the uppermost insulating layer 22 farthest from the base portion 1. The cover insulating film contains silicon oxide, for example.

The semiconductor storage device 100 includes a plurality of memory cells MC connected in series between the source-side select transistor STS and the drain-side select transistor STD. A structure in which the source-side select transistor STS, the memory cells MC, and the drain-side select transistor STD are connected in series is called a "memory string" or a "NAND string". The memory string is connected to a bit line BL via a contact Cb, for example. The bit line BL is provided above the stacked body 2 and extends in the Y direction.

A plurality of deep slits ST and a plurality of shallow slits SHE are provided in the stacked body 2. A "slit" means a portion including a groove and a conductor and/or an insulator embedded in the groove. The deep slit ST extends in the X direction, passes through the stacked body 2 from the upper end of the stacked body 2 to the base portion 1, and is provided in the stacked body 2. Though not shown in FIG. 1, the deep slit ST is filled with an insulator such as a silicon oxide film, for example, or the deep slit ST is filled with a conductor that is electrically connected to the semiconductor layer 13 while being electrically insulated from the stacked body 2 by an insulator; that is, the insulator coats the internal surface of the slit ST and the conductor is embedded in the insulator. Low-resistance metal such as tungsten, for example, is used as this conductor. The conductor is connected to the semiconductor layer 13 in the slit ST. The shallow slit SHE extends in the X direction and is provided from the upper end of the stacked body 2 halfway through the stacked body 2. The shallow slit SHE is filled with an insulator such as a silicon oxide film, for example.

As described above, the semiconductor storage device 100 according to the present embodiment includes the memory cell array MCA and the peripheral circuit (the CMOS circuit) located below the memory cell array MCA. The semiconductor layer 13 present between the memory cell array MCA and the peripheral circuit functions as a source layer of the memory cell array MCA.

Figure 2:
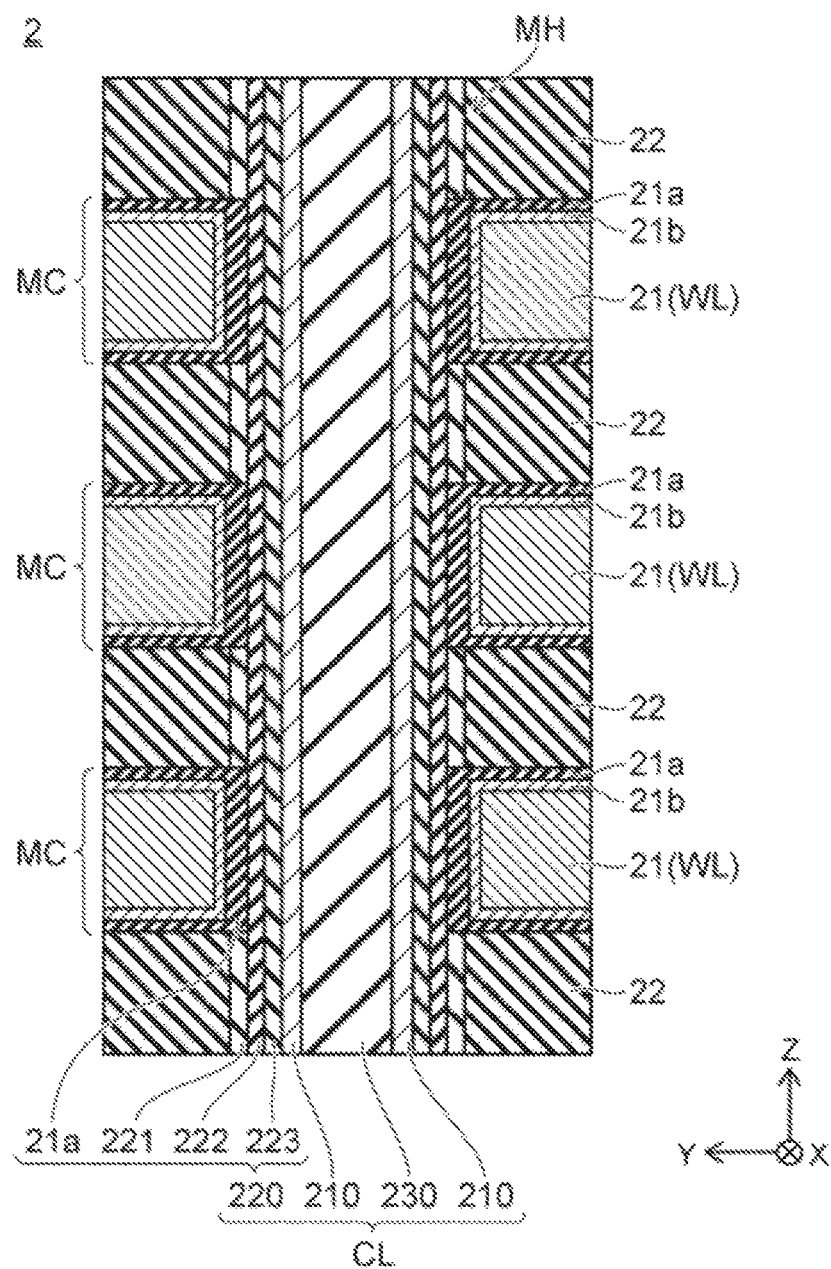
FIG. 2 is a sectional view showing an example of the configuration of a columnar portion.

FIG. 2 is a sectional view showing an example of the configuration of the columnar portion CL. Each of the plurality of columnar portions CL is provided in a memory hole MH provided in the stacked body 2 so as to pass through the stacked body 2. The memory hole MH passes through the stacked body 2 from the upper end of the stacked body 2 in the Z direction and is provided in the stacked body 2 and in the semiconductor layer 13. Each of the plurality of columnar portions CL includes a semiconductor body 210, a memory film 220, and a core layer 230. The semiconductor body 210 is electrically connected to the semiconductor layer 13. The memory film 220 has a charge capture portion between the semiconductor body 210 and the conductive layer 21. A plurality of columnar portions CL, each being selected from a corresponding one of fingers, which will be described later, are connected to one bit line BL via the contacts Cb. Each of the columnar portions CL is provided in a memory cell array region, for example.

Figure 3:
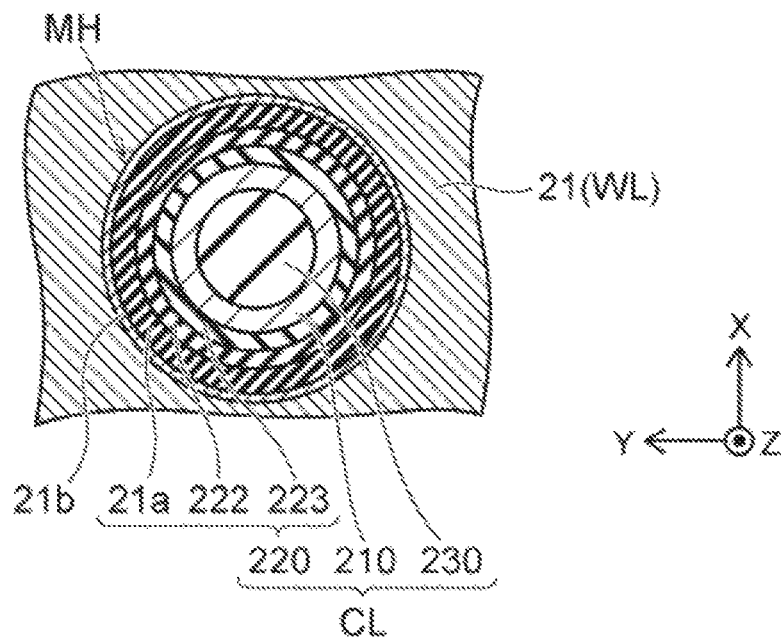
FIG. 3 is a plan view showing an example of the configuration of the columnar portion.

FIG. 3 is a plan view showing an example of the configuration of the columnar portion CL. The shape of the memory hole MH in the X-Y plane is a circle or an ellipse, for example. A block insulating film 21a constituting part of the memory film 220 may be provided between the conductive layer 21 and the insulating layer 22. The block insulating film 21a is a silicon oxide film or a metal oxide film, for example. One example of metal oxide is aluminum oxide. A barrier film 21b may be provided between the conductive layer 21 and the insulating layer 22 and between the conductive layer 21 and the memory film 220. When, for example, the conductive layer 21 is tungsten, a stacked-structure film of titanium nitride and titanium, for example, is selected as the barrier film 21b. The block insulating film 21a prevents back tunneling of charge from the conductive layer 21 to the memory film 220. The barrier film 21b increases the adhesion between the conductive layer 21 and the block insulating film 21a.

The shape of the semiconductor body 210 is a tube closed at one end, for example. The semiconductor body 210 contains silicon, for example. Silicon is, for example, polysilicon obtained by crystalizing amorphous silicon. The semiconductor body 210 is undoped silicon, for example. Moreover, the semiconductor body 210 may be p-type silicon. The semiconductor body 210 serves as a channel of the drain-side select transistor STD, the memory cells MC, and the source-side select transistor STS.

Portions of the memory film 220 other than the block insulating film 21a are provided between the inner wall of the memory hole MH and the semiconductor body 210. The shape of the memory film 220 is a tube, for example. The plurality of memory cells MC each have a storage region between the semiconductor body 210 and the conductive layer 21 which serves as the word line WL, and are stacked in the Z direction. The memory film 220 includes a cover insulating film 221, a charge capture film 222, and a tunnel insulating film 223, for example. The semiconductor body 210, the charge capture film 222, and the tunnel insulating film 223 extend in the Z direction.

The cover insulating film 221 is provided between the insulating layer 22 and the charge capture film 222. The cover insulating film 221 contains silicon oxide, for example. When a sacrifice film (which is not shown in FIG. 2 and FIG. 3) is replaced with the conductive layer 21 (a replacement process), the cover insulating film 221 protects the charge capture film 222 from being etched. The cover insulating film 221 may be removed from between the conductive layer 21 and the memory film 220 in the replacement process. In this case, as shown in FIG. 2 and FIG. 3, the block insulating film 21a, for example, is provided between the conductive layer 21 and the charge capture film 222. Moreover, when the replacement process is not used for the formation of the conductive layer 21, there is no need to provide the cover insulating film 221.

The charge capture film 222 is provided between the block insulating film 21a and the tunnel insulating film 223 and between the cover insulating film 221 and the tunnel insulating film 223. The charge capture film 222 contains silicon nitride, for example, and has a trap site that traps charge in the film. A portion, which is sandwiched between the conductive layer 21, which serves as the word line WL, and the semiconductor body 210, of the charge capture film 222 constitutes the storage region of the memory cell MC as the charge capture portion. A threshold voltage of the memory cell MC varies depending on the presence or absence of charge in the charge capture portion or the amount of charge captured in the charge capture portion. This allows the memory cell MC to store information.

The tunnel insulating film 223 is provided between the semiconductor body 210 and the charge capture film 222. The tunnel insulating film 223 contains silicon oxide or silicon oxide and silicon nitride, for example. The tunnel insulating film 223 is a potential barrier between the semiconductor body 210 and the charge capture film 222. For example, when an electron is injected into the charge capture portion from the semiconductor body 210 (a write operation) and when a positive hole is injected into the charge capture portion from the semiconductor body 210 (an erasing operation), the electron and the positive hole pass through the tunnel insulating film 223, namely, the potential barrier (tunneling).

The core layer 230 fills an internal space of the semiconductor body 210 in the shape of a tube. The shape of the core layer 230 is a column, for example. The core layer 230 contains silicon oxide, for example, and has insulating properties.

Figure 4:
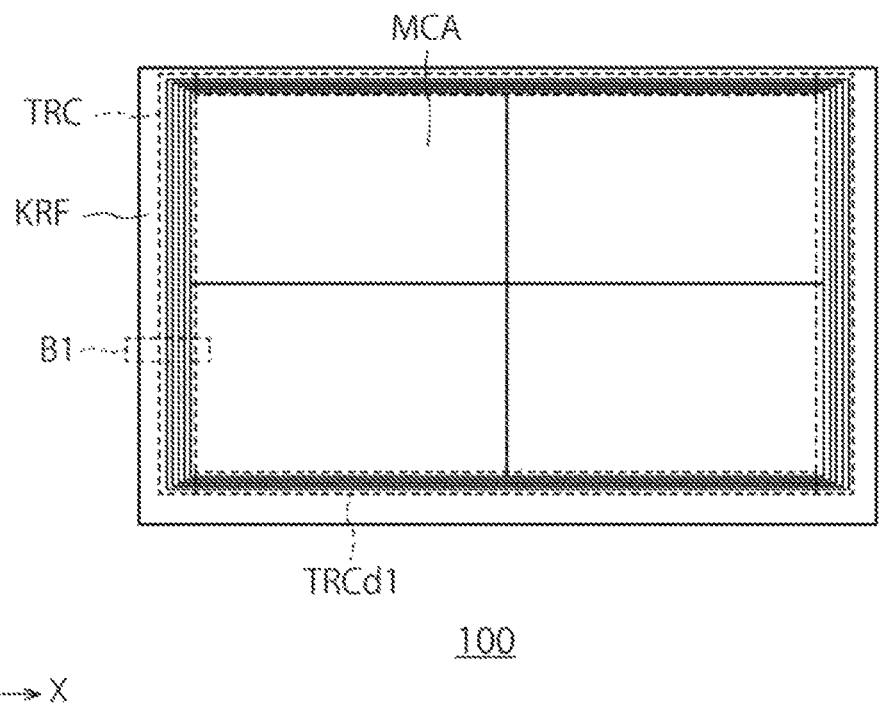
FIG. 4 is a plan view showing an example of the configuration of the semiconductor storage device according to the first embodiment.

FIG. 4 is a plan view showing an example of the configuration of the semiconductor storage device according to the first embodiment. FIG. 4 shows one memory chip or FIG. 4 shows one chip region of a semiconductor wafer.

In the semiconductor storage device 100, as in the case of FIG. 1, the word lines WL extend in the X direction and the bit lines BL extend in the Y direction. Terrace regions TRC of the word lines WL are provided in side portions of the memory cell array MCA which are located on both sides thereof in the X direction. The terrace region TRC is a region in which the word lines WL were worked on so as to have a staircase pattern, and connects contact plugs to the word lines WL. Moreover, dummy terrace regions TRCd1 of the word lines WL are provided on both sides of the memory cell array MCA in the Y direction. As in the case of the terrace region TRC, the dummy terrace region TRCd1 is a region in which the word lines WL were worked on so as to have a staircase pattern, and is formed in the process in which the terrace region TRC is formed. However, the dummy terrace region TRCd1 is not used for connection of the word lines WL. As shown in FIG. 1, the peripheral circuit (for example, the CMOS circuit) that controls the memory cell array MCA is provided below the memory cell array MCA. There is a kerf region KRF around the terrace regions TRC and the dummy terrace regions TRCd1. The configuration of the kerf region KRF will be described in detail with reference to FIG. 5.

Figure 5:
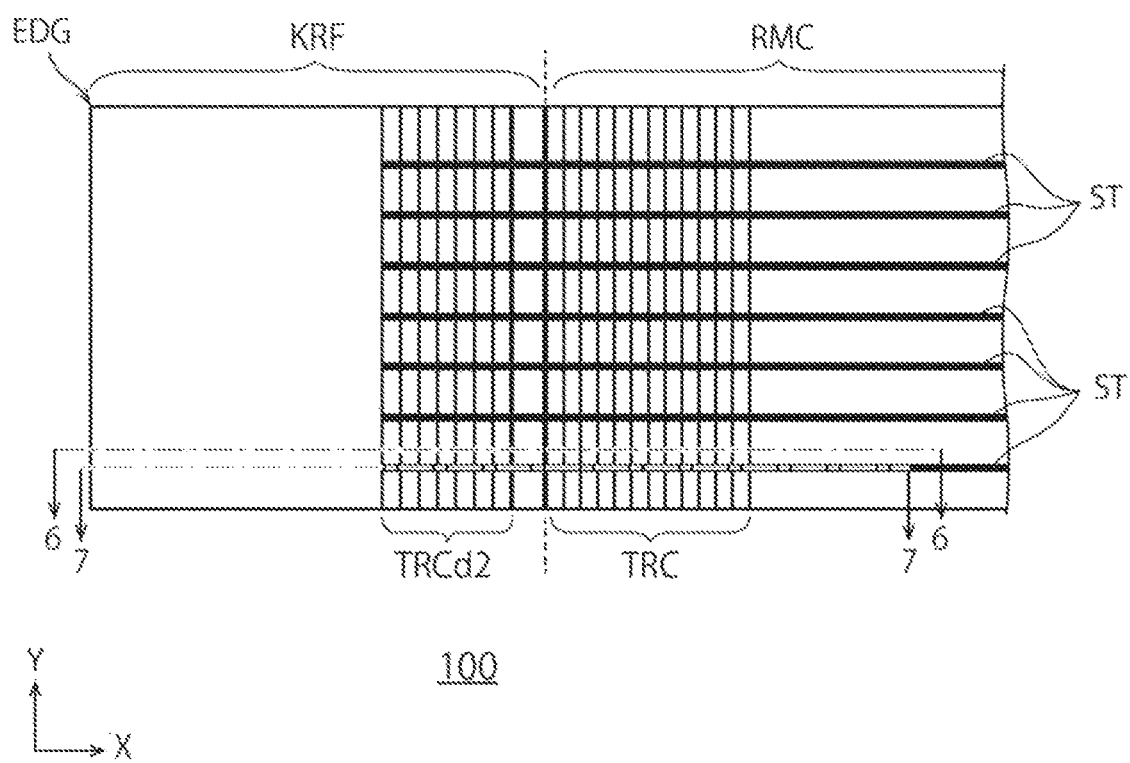
FIG. 5 is a plan view showing a configuration in a frame B1 of FIG. 4.
Figure 6:
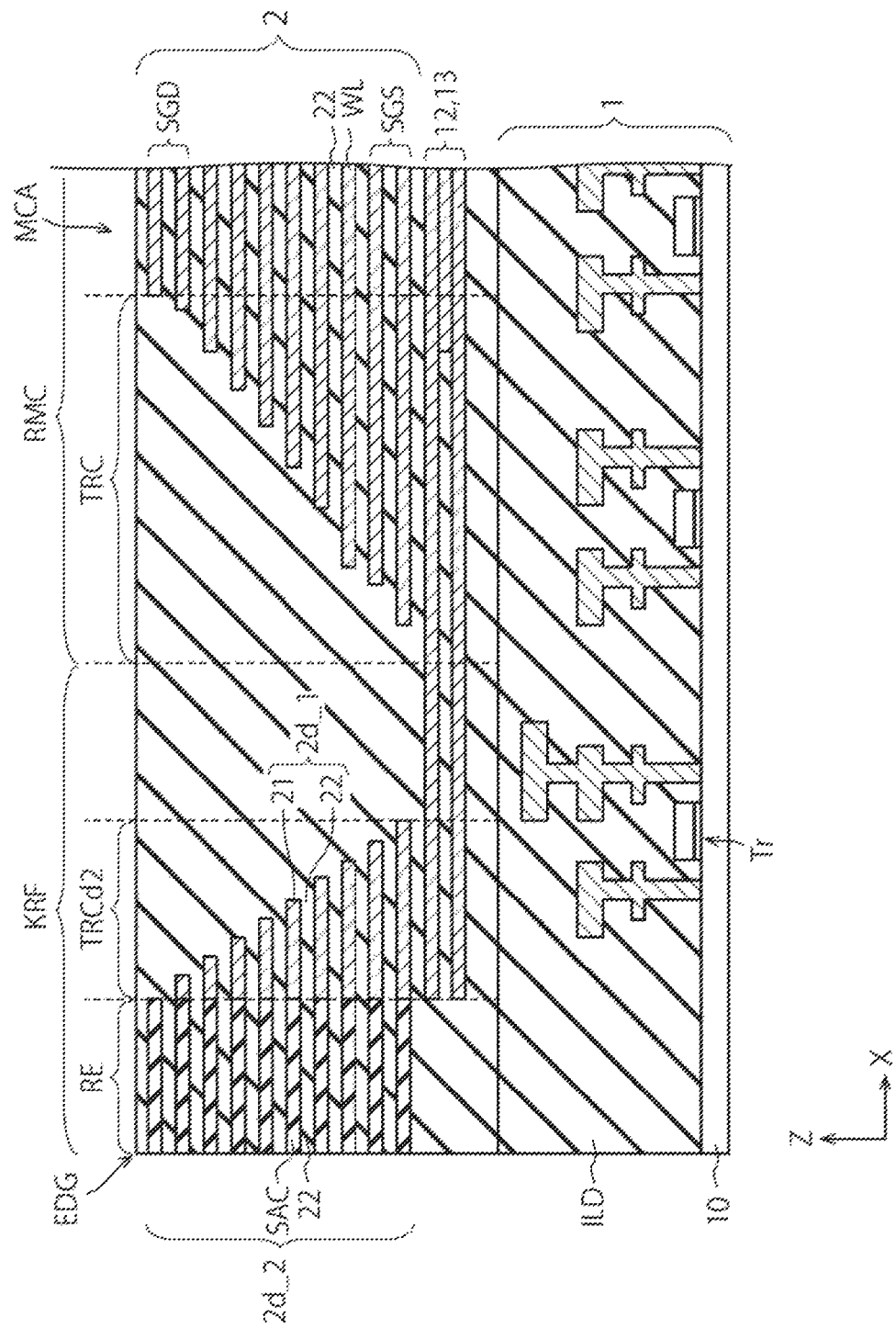
FIG. 6 is a sectional view taken along the line 6-6 of FIG. 5.
Figure 7:
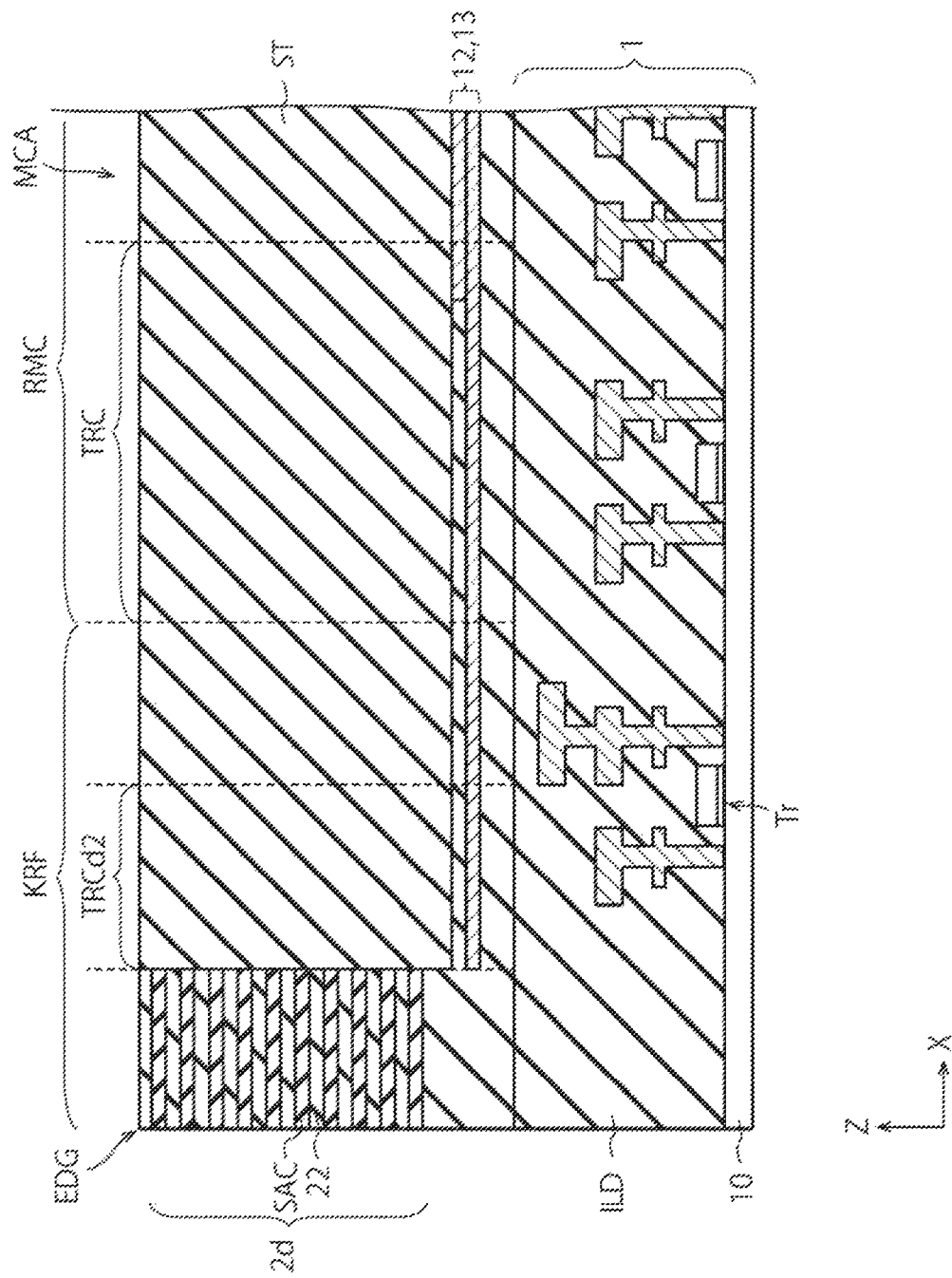
FIG. 7 is a sectional view taken along the line 7-7 of FIG. 5.

FIG. 5 is a plan view showing a configuration in a frame B1 of FIG. 4. FIG. 6 is a sectional view taken along the line 6-6 of FIG. 5. FIG. 7 is a sectional view taken along the line 7-7 of FIG. 5.

The semiconductor storage device 100 includes a cell region RMC including the memory cell array MCA and the kerf region KRF which is provided around the cell region RMC and does not include the memory cell array MCA. The cell region RMC is provided in the center of the memory chip, and the kerf region KRF is provided at the edge of the memory chip (i.e., in an outer edge portion of the substrate 10). The outer edge of the kerf region KRF is a chip edge EDG. The base portion 1 including the CMOS circuit is provided below the cell region RMC and the kerf region KRF. The kerf region KRF is provided on the entire periphery of the memory chip; however, part of the kerf region KRF may be absent by dicing.

The stacked body 2 is provided in the memory cell array MCA in the cell region RMC. The configuration of the stacked body 2 was already described above with reference to FIG. 1.

As shown in FIG. 6, in the terrace region TRC of the cell region RMC, the word lines WL are configured in a staircase pattern. The contact plugs which are connected to the word lines WL are not shown in FIG. 6. Moreover, the conductive film 12 and the semiconductor layer 13 are provided below the cell region RMC and part of the kerf region KRF.

On the other hand, in the kerf region KRF, dummy stacked bodies 2d_1 and 2d_2 are provided around the stacked body 2 so as to face the side portions of the stacked body 2. The kerf region KRF has a dummy terrace region TRCd2 and an edge region RE which is a region other than the dummy terrace region TRCd2. For the sake of convenience, a dummy stacked body in the dummy terrace region TRCd2 is assumed to be the dummy stacked body 2d_1 and a dummy stacked body in the edge region RE is assumed to be the dummy stacked body 2d_2.

The dummy stacked body 2d_1 is configured with a plurality of insulating layers 22 and a plurality of conductive layers 21 which are alternately stacked. A silicon oxide film, for example, is used as the insulating layer 22. The same material (for example, metal such as tungsten) as the word line WL is used for the conductive layer 21. The conductive layer 21 is formed concurrently with the formation of the word line WL. That is, when an insulating layer SAC is replaced with a metallic material in the cell region RMC, the insulating layer SAC in the dummy terrace region TRCd2 is also replaced with the metallic material at the same time. As a result, the conductive layer 21 is formed in the dummy terrace region TRC2d. The insulating layer SAC is a sacrifice film that is placed between the insulating layers 22 before the word line WL (i.e., the conductive layer 21) of the stacked body 2 is obtained by replacement with metal such as tungsten. Thus, since the insulating layer SAC of the dummy stacked body 2d_1 is replaced with the conductive layer 21 by the replacement process, the insulating layer SAC does not remain in the dummy stacked body 2d_1 of FIG. 6.

The replacement process is a process in which, from a stacked body of the insulating layers 22 (for example, silicon oxide films) and the insulating layers SAC (for example, silicon nitride films), the insulating layers SAC are removed by etching via the grooves of the slits ST, which are not yet filled with oxide or the like, and the spaces in which the insulating layers SAC were present are filled with a conductor. As described above, the replacement process is performed via the grooves of the slits ST which are not yet filled with an insulator or a conductor. When the grooves of the slits ST are formed, the conductive film 12 and the semiconductor layer 13 function as etching stoppers. Therefore, the conductive film 12 and the semiconductor layer 13 are provided immediately below the slits ST in positions corresponding thereto. In the present embodiment, the conductive film 12 and the semiconductor layer 13 are provided along with the slits ST not only below the cell region RMC, but also below the dummy terrace region TRC2d of the kerf region KRF.

The dummy stacked body 2d_2 in the edge region RE continuously connects to the dummy stacked body 2d_1 and is a stacked body configured with the insulating layers 22 and the insulating layers SAC which are alternately stacked. A silicon nitride film, for example, is used as the insulating layer SAC. The insulating layer SAC remains in the dummy stacked body 2d_2 without being replaced with metal such as tungsten. Therefore, the slits ST which are used for the replacement process are not necessary in the edge region RE and are not provided below the edge region RE. For this reason, the conductive film 12 and the semiconductor layer 13 are also not provided below the edge region RE.

Moreover, in the side portion facing the stacked body 2, the dummy stacked body 2d_1 in the dummy terrace region TRC2d is formed in a staircase pattern like the stacked body 2. The dummy stacked body 2d_1 faces the terrace region TRC of the stacked body 2, and the dummy stacked body 2d_1 and the terrace region TRC may be mirror-image symmetric.

Furthermore, as shown in FIG. 5, when viewed from the stacking direction (Z direction) of the stacked body 2, the slits ST extend in an arrangement direction (X direction) of the stacked body 2 and the dummy stacked body 2d_1. The slits ST are also provided in the memory cell array MCA in the cell region RMC and are provided from the cell region RMC to the dummy stacked body 2d_1 in the kerf region KRF. On the other hand, the slits ST are not provided in the dummy stacked body 2d_2 in the kerf region KRF on the side thereof where the chip edge EDG is located.

As shown in FIG. 7, the slit ST passes through the stacked body 2 and the dummy stacked body 2d_1 from the upper surface of the stacked body 2 and the dummy stacked body 2d_1 and reaches the conductive film 12 or the semiconductor layer 13, which functions as the etching stopper. In the present embodiment, the slit ST is a plate-like member continuously provided from the cell region RMC to the kerf region KRF. The slit ST is configured with a groove, which passes through the stacked body 2 and the dummy stacked body 2d_1 and reaches the conductive film 12 or the semiconductor layer 13, and an insulating film (for example, a silicon oxide film or the like) embedded in the groove, or the slit ST is configured with a groove passing through the stacked body 2 and the dummy stacked body 2d_1, an insulating film (for example, a silicon oxide film) coating the internal surface of the groove, and a conductor (for example, tungsten, doped polysilicon, or the like) embedded in the insulating film. The slits ST of the stacked body 2 and the slits ST of the dummy stacked body 2d_1 are formed in the same process and have the same structure.

The semiconductor storage device 100 configured as described above includes, in the kerf region KRF, the dummy stacked body 2d_1 facing the stacked body 2 in the cell region RMC. The dummy stacked body 2d_1 faces the terrace region TRC of the stacked body 2 and has a staircase configuration which is almost identical or similar to that of the terrace region TRC. This reduces stress which is applied in the cell region RMC and the kerf region KRF of the semiconductor storage device 100 as compared to when the dummy stacked bodies 2d_1 and 2d_2 are not provided.

For example, as compared to when a tetraethylorthosilicate (TEOS) film is provided all over the kerf region KRF, the structure of the kerf region KRF of the present embodiment is close to the structure of the terrace region TRC of the cell region RMC. Thus, according to the present embodiment, stress between the cell region RMC and the kerf region KRF is alleviated.

Moreover, the slits ST are provided not only in the stacked body 2 in the cell region RMC, but also in the dummy stacked body 2d_1 in the kerf region KRF around the cell region RMC. As shown in FIG. 5, the slits ST are arranged in the Y direction at almost regular intervals and have the function of absorbing stress which is applied to the cell region RMC and the kerf region KRF. Thus, stress which is applied to the cell region RMC and the kerf region KRF is further alleviated by the slits ST.

This makes it possible to prevent a crystal defect in the substrate 10 in a boundary portion between the cell region RMC and the kerf region KRF.

Second Embodiment

Figure 8:
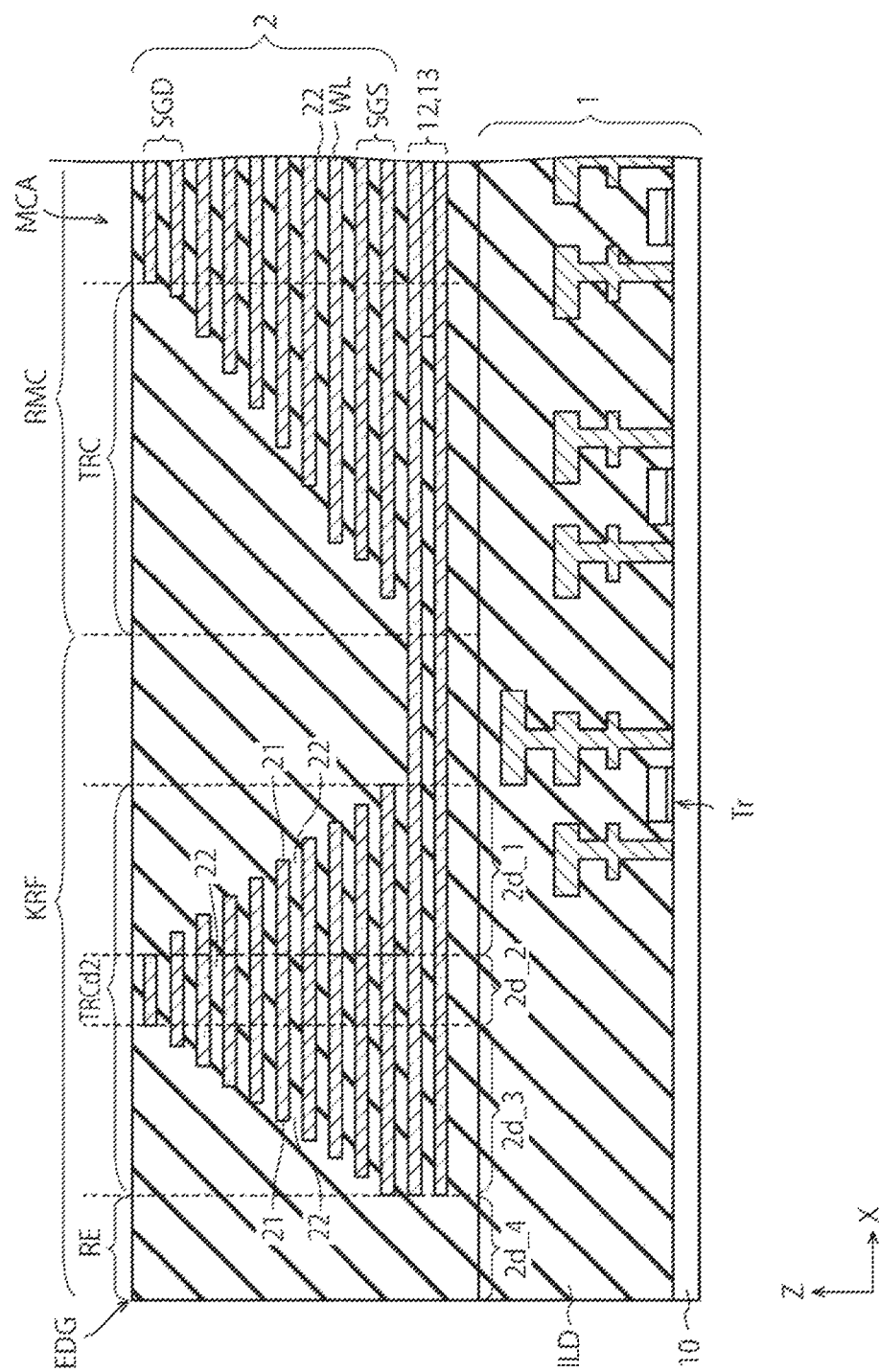
FIG. 8 is a sectional view showing an example of the configuration of a semiconductor storage device according to a second embodiment.

FIG. 8 is a sectional view showing an example of the configuration of a semiconductor storage device according to a second embodiment. FIG. 8 shows a cross section taken along the line 6-6 of FIG. 5. The semiconductor storage device according to the second embodiment is different from the first embodiment in the configuration of a kerf region KRF. A dummy terrace region TRC2d of the second embodiment includes dummy stacked bodies 2d_1 to 2d_3. The configuration of the dummy stacked body 2d_1 may be similar to the configuration of that of the first embodiment.

In the second embodiment, the dummy stacked body 2d_2 has basically the same configuration as the dummy stacked body 2d_1 and is configured with a plurality of insulating layers 22 and a plurality of conductive layers 21 which are alternately stacked. Moreover, the dummy stacked body 2d_3 continuously connects to the dummy stacked body 2d_2. The dummy stacked body 2d_3 has basically the same configuration as the dummy stacked body 2d_1 and is configured with the plurality of insulating layers 22 and the plurality of conductive layers 21 which are alternately stacked. The dummy stacked body 2d_3 and the dummy stacked body 2d_1 are approximately mirror-image symmetric. As in the case of a terrace region TRC of a stacked body 2, the dummy stacked body 2d_3 is also configured in a staircase pattern. As in the case of the conductive layers 21 of the first embodiment, since the conductive layers 21 are formed in the replacement process, a conductive film 12 and a semiconductor layer 13 which function as etching stoppers are also provided below the dummy stacked bodies 2d_2 and 2d_3.

A stacked body is not provided in an edge region RE outside the dummy stacked body 2d_3, and an insulating film 2d_4 coats a side portion of the dummy stacked body 2d_3. The insulating film 2d_4 continuously connects to the dummy stacked body 2d_3. A material similar to that is used for an interlayer insulating film ILD, for example, a TEOS film is used for the insulating film 2d_4.

As described above, the dummy terrace region TRC2d may have a configuration which is symmetric in the X direction. The rest of the configuration of the second embodiment may be similar to a corresponding configuration of the first embodiment. Thus, the second embodiment can obtain an effect similar to that of the first embodiment.

Third Embodiment

Figure 9:
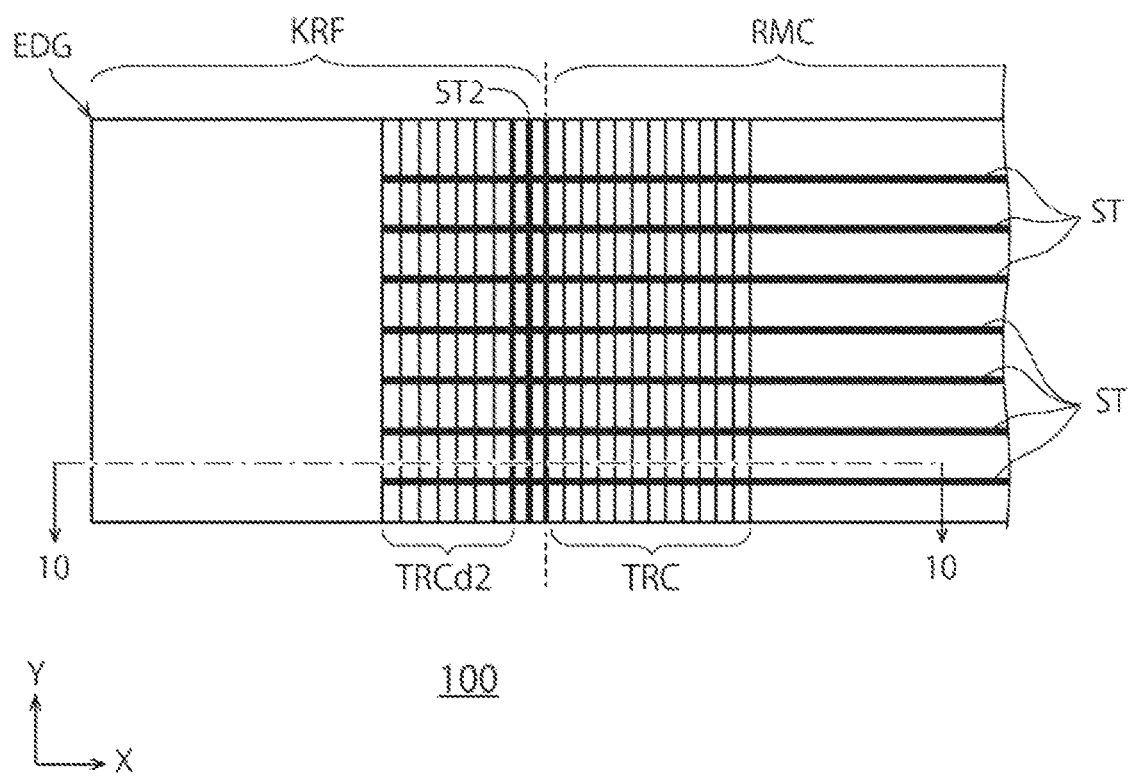
FIG. 9 is a plan view showing an example of the configuration of a semiconductor storage device according to a third embodiment.
Figure 10:
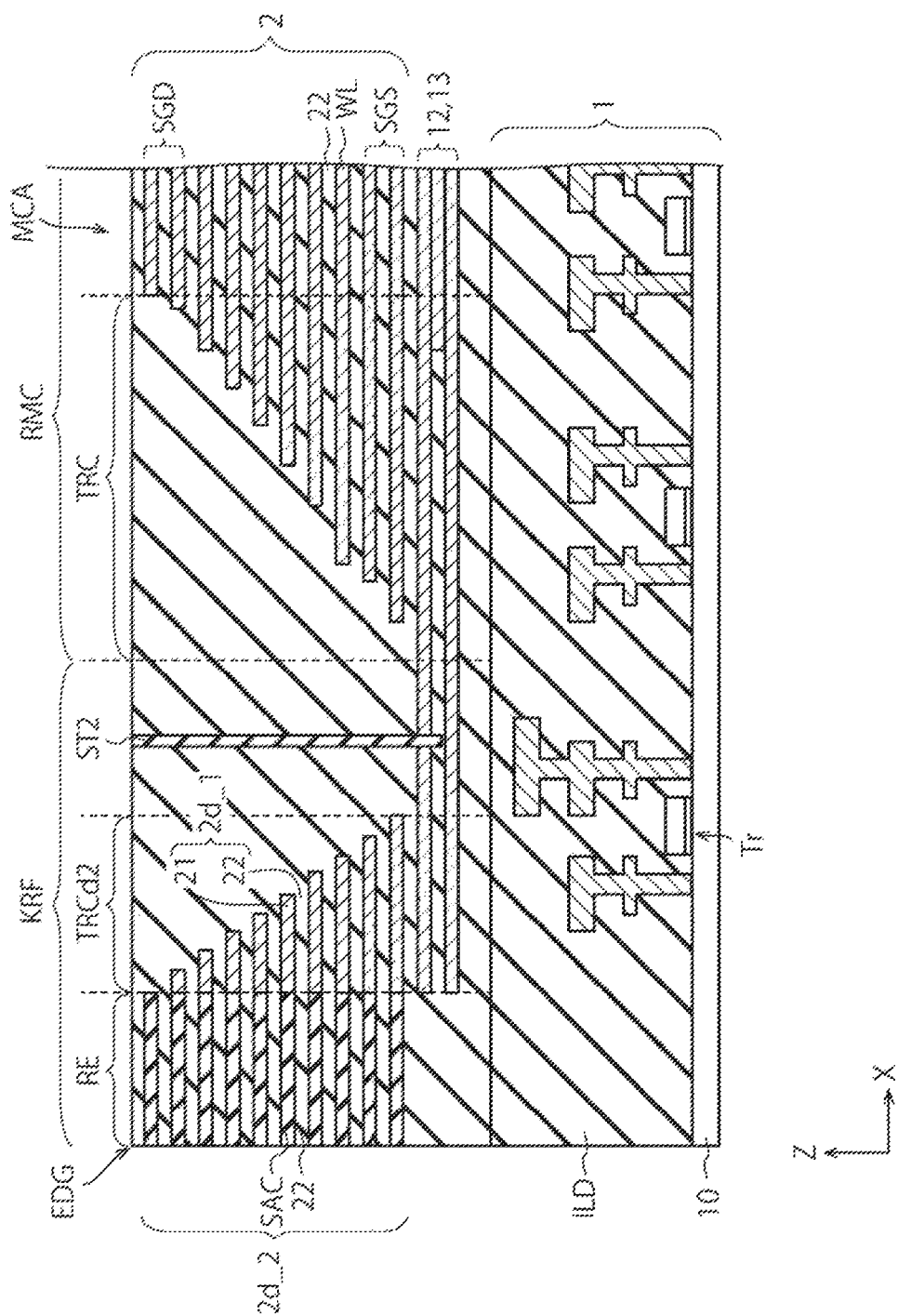
FIG. 10 is a sectional view taken along the line 10-10 of FIG. 9.

FIG. 9 is a plan view showing an example of the configuration of a semiconductor storage device according to a third embodiment. FIG. 10 is a sectional view taken along the line 10-10 of FIG. 9. In the third embodiment, when viewed from a stacking direction (Z direction) of a stacked body 2, as shown in FIG. 9, a slit ST2 is provided between a cell region RMC and a kerf region KRF so as to extend in the Y direction intersecting (for example, nearly orthogonal to) slits ST.

As shown in FIG. 10, the slit ST2 is provided between the stacked body 2 and a dummy stacked body 2d_1 so as to pass through an interlayer insulating film to a conductive film 12 or a semiconductor layer 13. The configuration of the slit ST2 may be the same as that of the slit ST. The rest of the configuration of the third embodiment may be similar to the configuration of the first embodiment.

As described above, by providing the slit ST2 so as to separate the cell region RMC and the kerf region KRF, it is possible to prevent stress of one of the kerf region KRF and the cell region RMC from being transmitted to the other. Moreover, the third embodiment can obtain a configuration similar to that of the first embodiment.

The third embodiment may be combined with the second embodiment. This allows the third embodiment to obtain an effect similar to that of the second embodiment.

Fourth Embodiment

Figure 11:
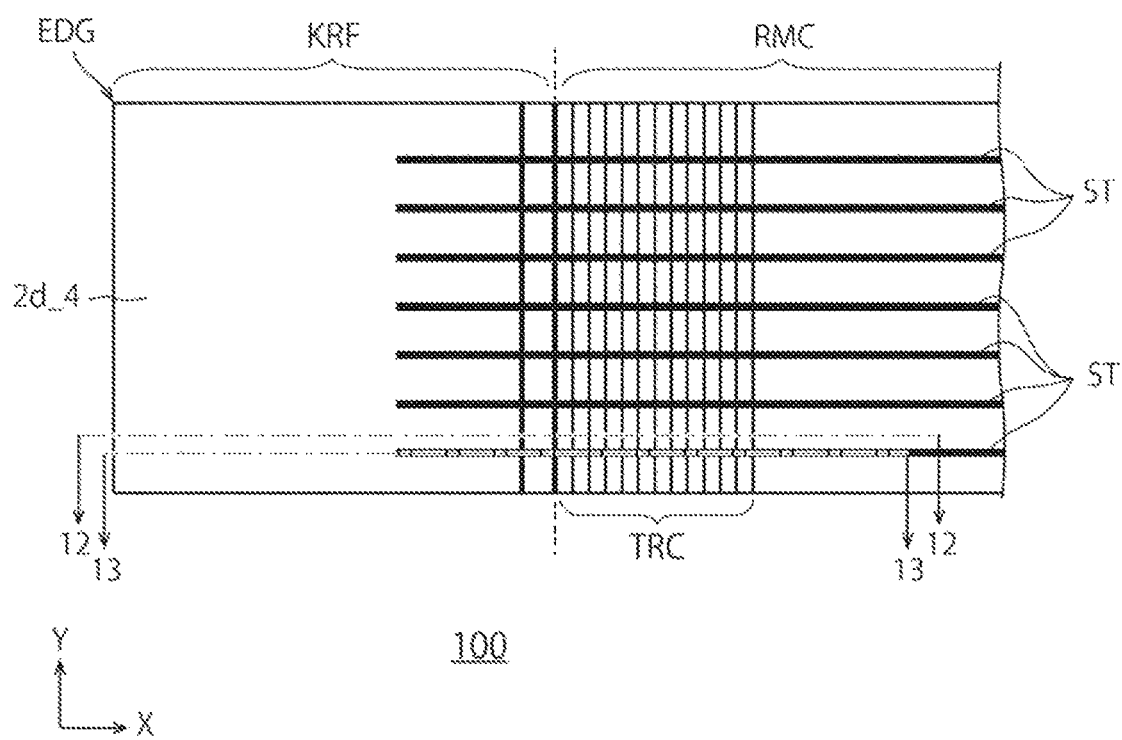
FIG. 11 is a plan view showing an example of the configuration of a semiconductor storage device according to a fourth embodiment.
Figure 12:
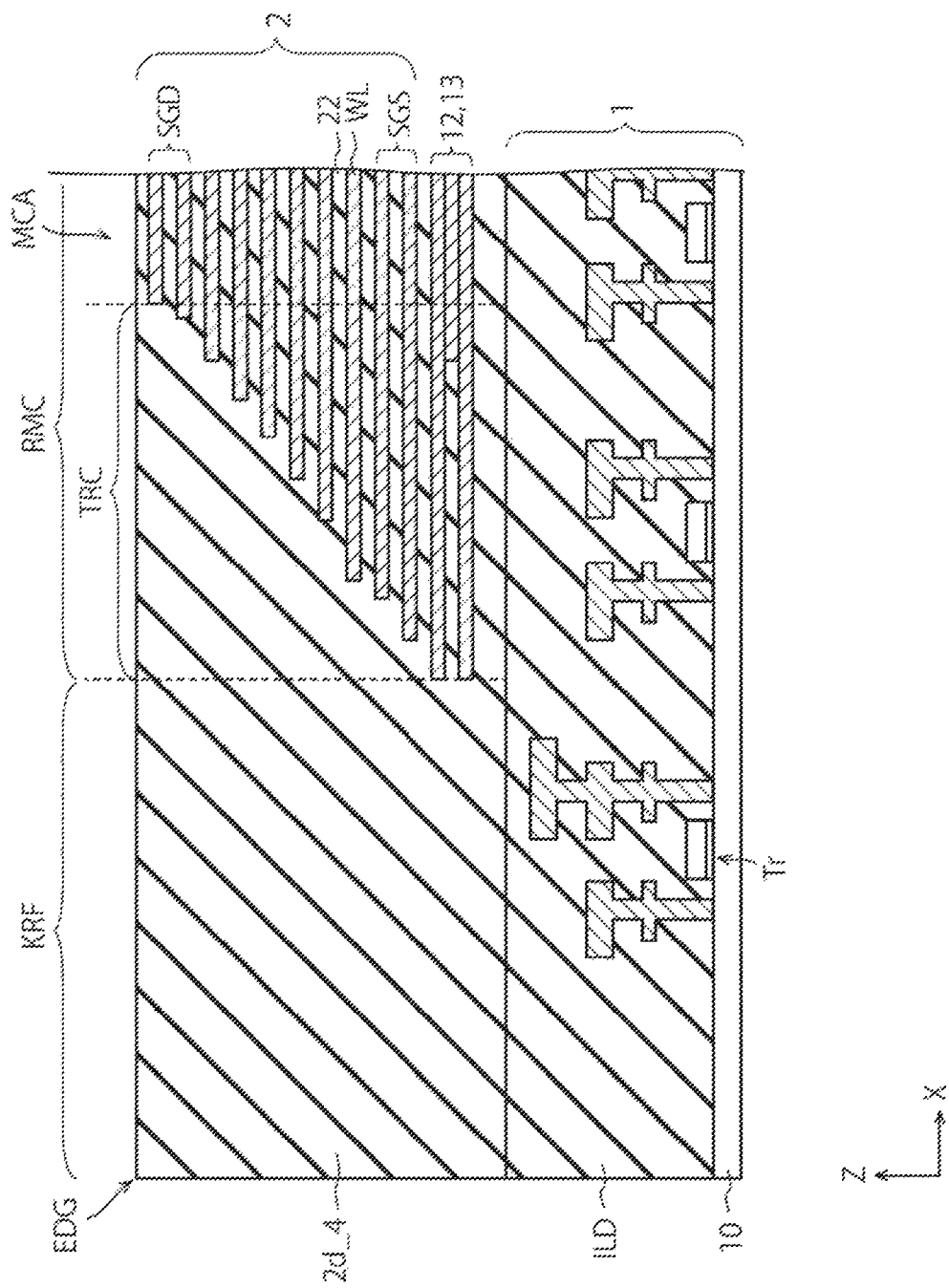
FIG. 12 is a sectional view taken along the line 12-12 of FIG. 11.
Figure 13:
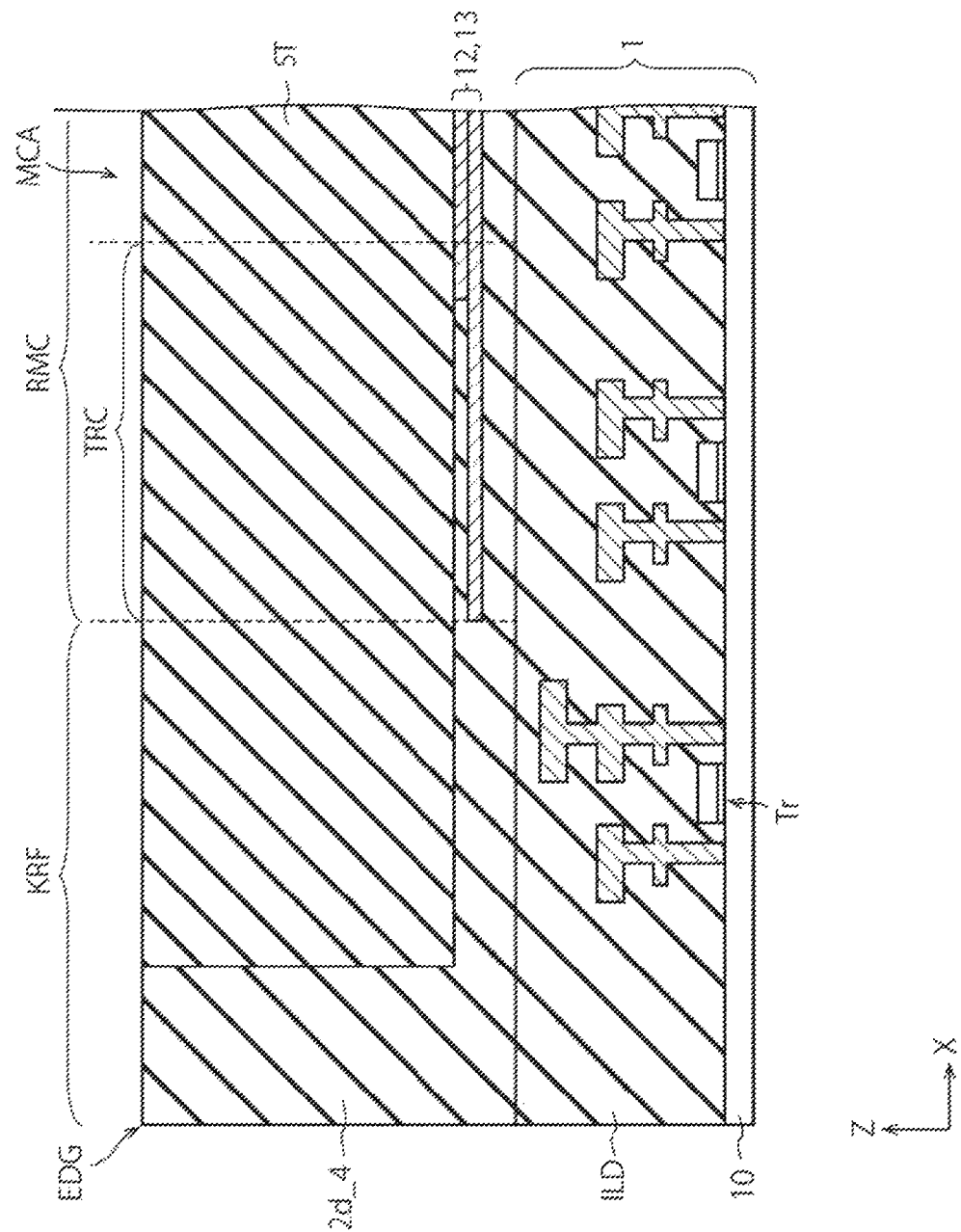
FIG. 13 is a sectional view taken along the line 13-13 of FIG. 11.

FIG. 11 is a plan view showing an example of the configuration of a semiconductor storage device according to a fourth embodiment. FIG. 12 is a sectional view taken along the line 12-12 of FIG. 11. FIG. 13 is a sectional view taken along the line 13-13 of FIG. 11.

In the fourth embodiment, as shown in FIG. 11 and FIG. 12, a dummy terrace region TRC2d is not provided in a kerf region KRF and an insulating film 2d_4 is provided all over the kerf region KRF. Therefore, the insulating film 2d_4 is provided around a stacked body 2 and faces a side portion of the stacked body 2. The insulating film 2d_4 may have the same configuration as that of the second embodiment and is configured with a TEOS film, for example.

On the other hand, as shown in FIG. 11 and FIG. 13, slits ST are provided not only in a cell region RMC, but also in part of the kerf region KRF. That is, the slits ST are also provided in part of the insulating film 2d_4 on the side thereof facing the cell region RMC. The slits ST extend in an arrangement direction of the stacked body 2 and the insulating film 2d_4 as shown in FIG. 11 when viewed from a stacking direction (Z direction) and pass through the stacked body 2 and the insulating layer 2d_4 as shown in FIG. 13.

The semiconductor storage device according to the fourth embodiment does not have a dummy stacked body 2d_1 facing the stacked body 2 in the cell region RMC. However, the slits ST are provided not only in the stacked body 2 in the cell region RMC, but also in the insulating film 2d_4 in the kerf region KRF around the cell region RMC. As in the first embodiment, the slits ST are arranged in the Y direction at almost regular intervals and have the function of absorbing stress which is applied to the cell region RMC and the kerf region KRF. Thus, stress which is applied to the cell region RMC and the kerf region KRF is alleviated by the slits ST. This makes it possible to prevent to some extent a crystal defect in a substrate 10 in a boundary portion between the cell region RMC and the kerf region KRF.

Fifth Embodiment

Figure 14:
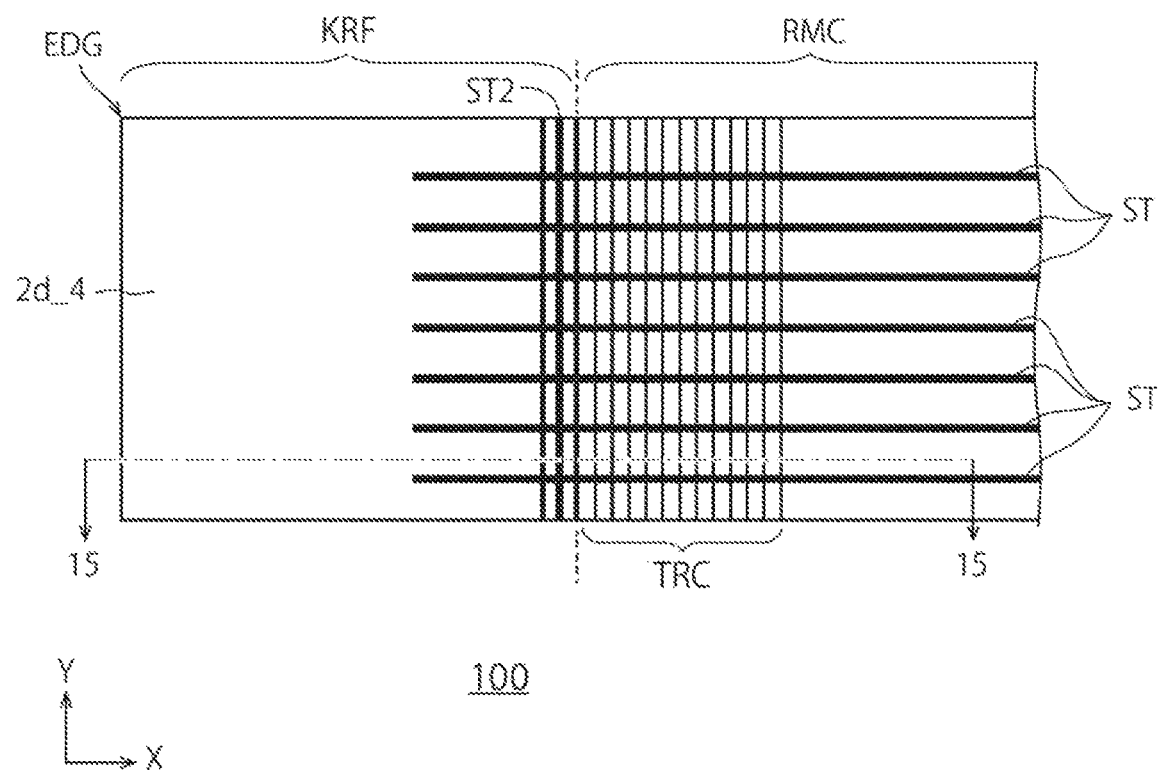
FIG. 14 is a plan view showing an example of the configuration of a semiconductor storage device according to a fifth embodiment.
Figure 15:
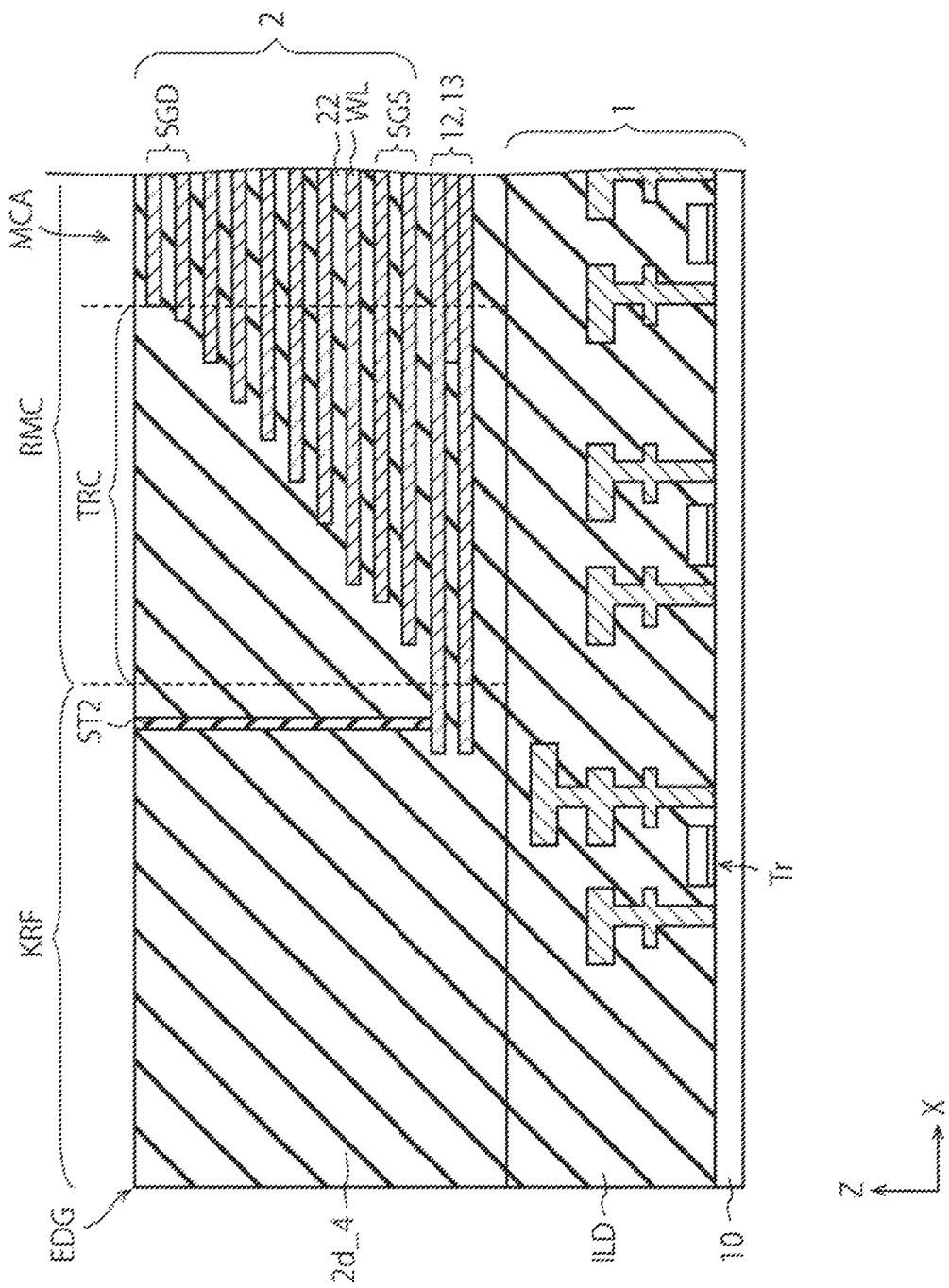
FIG. 15 is a sectional view taken along the line 15-15 of FIG. 14.

FIG. 14 is a plan view showing an example of the configuration of a semiconductor storage device according to a fifth embodiment. FIG. 15 is a sectional view taken along the line 15-15 of FIG. 14. The fifth embodiment is an embodiment obtained by applying the slits ST2 of the third embodiment to the fourth embodiment.

When viewed from a stacking direction (Z direction), the slits ST2 are provided between a stacked body 2 and an insulating film 2d_4. The slits ST2 are provided between the stacked body 2 and the insulating film 2d_4 so as to pass through the insulating film 2d_4 to a conductive film 12 or a semiconductor layer 13. The configuration of the slit ST2 may be the same as that of a slit ST. The conductive film 12 and the semiconductor layer 13 which function as etching stoppers are also provided below the slits ST2 as shown in FIG. 15. The rest of the configuration of the fifth embodiment may be similar to the configuration of the third or fourth embodiment.

This allows the fifth embodiment to obtain effects similar to those of the third and fourth embodiments.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
  a substrate;
  a first stacked body provided above the substrate, the first stacked body including a plurality of first insulating layers and a plurality of conductive layers alternately stacked in a first direction, the first stacked body including a first region and a second region next to the first region in a second direction crossing the first direction and having a staircase pattern;
  a plurality of columnar portions passing through the first region of the first stacked body;

a second stacked body provided next to the second region of the first stacked body in the second direction and including the plurality of first insulating layers and the plurality of conductive layers alternately stacked in the first direction, the second stacked body having a staircase pattern;

a plurality of first slits extending through the first stacked body and the second stacked body in the second direction;

a third stacked body provided next to the second stacked body in the second direction, the third stacked body including the plurality of first insulating layers and a plurality of second insulating layers alternately stacked in the first direction, at least one of the plurality of the second insulating layers respectively connected to at least one of the plurality of conductive layers of the second stacked body;

an outer edge of the substrate provided next to the third stacked body in the second direction, wherein the plurality of first insulating layers and the plurality of second insulating layers are different in material from each other, wherein the third stacked body is a dummy stacked body that is not used for connection of word lines; and a second slit, which extends in a direction intersecting the first slits, between the first stacked body and the second stacked body, wherein the second stacked body is a dummy stacked body that is not used for connection of word lines;

a third insulating layer provided around the third stacked body, wherein the first slits does not extend through the third stacked body, wherein the plurality of first insulating layers are silicon oxide film layers, and the plurality of conductive layers are tungsten layers.

2. The semiconductor storage device according to claim 1, wherein the staircase pattern in the second stacked body is identical to the staircase pattern in the first stacked body.

3. The semiconductor storage device according to claim 1, the plurality of first slits are arranged at regular intervals direction intersecting the stacking direction of the first stacked body.

* * * * *